United States Patent
Wang et al.

(10) Patent No.: US 6,207,567 B1
(45) Date of Patent: Mar. 27, 2001

(54) FABRICATING METHOD OF GLUE LAYER AND BARRIER LAYER

(75) Inventors: Chein-Cheng Wang, Taichung Hsien; Shih-Chanh Chang, Hsinchu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/290,059

(22) Filed: Apr. 12, 1999

(51) Int. Cl.[7] .................................................. H01L 21/44
(52) U.S. Cl. ........................ 438/685; 438/644; 438/643; 438/681; 438/653
(58) Field of Search ..................................... 438/685, 627, 438/643, 648, 798, 656, 681, 644, 653; 204/192.12, 192.17, 298.11

(56) References Cited

U.S. PATENT DOCUMENTS

| 5,567,483 | * | 10/1996 | Foster et al. ............................ 427/535 |
| 5,584,973 | * | 12/1996 | Wada et al. ........................... 204/192.12 |
| 5,874,355 | * | 2/1999 | Huang et al. .............................. 438/627 |
| 5,886,213 | * | 2/1999 | Foster et al. .............................. 427/573 |

* cited by examiner

Primary Examiner—Matthew Smith
Assistant Examiner—Igwe U. Anya
(74) Attorney, Agent, or Firm—Martine Penilla & Kim, LLP

(57) ABSTRACT

A method of fabricating a glue layer and a barrier layer. A Ti layer is formed with a collimator sputtering in the via opening or the contact opening of the substrate. Through the control of flow of $N_2$ and Ar, a nitride mode $TiN_x$ layer is formed on the Ti layer by sputtering. The nitride mode $TiN_x$ layer and the Ti layer uncovered by the nitride mode $TiN_x$ layer are treated with $N_2$ RF plasma. This strengthens the structure of the nitride mode $TiN_x$ layer and allows the reaction with the exposed Ti layer so that it is transformed into a $TiN_x$ layer.

14 Claims, 3 Drawing Sheets

FABRICATING METHOD OF GLUE LAYER AND BARRIER LAYER

BACKGROUND OF THE INVENTION

1. Field of Invention

The present invention relates to a method of fabricating an integrated circuit. More particularly, the present invention relates to a fabricating method for forming a glue layer and a barrier layer.

2. Description of Related Art

Among all metal materials, tungsten has an advantageous high melting point, heat expansion ratio, and correspondence to silicon. In addition, tungsten deposited by chemical vapor deposition (CVD) does not have a high internal stress, and has a better step coverage. Thus, the manufacture of a metal plug with tungsten deposited by CVD has been widely used in the secondary micrometer process.

It is well known that a glue layer, also known as a barrier layer is formed between the surface of a contact opening or via opening and the metal plug to improve the adhesion between the tungsten plug and other materials. For example, $TiN_x$ is most often used as the material for glue layer in the present process. However, a metal nitride layer is usually added below the $TiN_x$ so that the contact resistance between the $TiN_x$ and bottom material of the contact opening or via opening is reduced.

The Ti layer and the $TiN_x$ layer are usually deposited by sputtering in the process of the integrated circuits. However, the $TiN_x$ layer formed by sputtering has poor step coverage and poor filling. To improve the step coverage and the filling of the $TiN_x$ layer, the $TiN_x$ layer is deposited by a collimator sputtering. Thus, this improves the deposition by sputtering at the bottom of the contact opening or via opening.

However, there is limited step coverage to the bottom corner of the contact opening and via opening with the above method. The $TiN_x$ layer is unable to completely cover the Ti layer below while part of the Ti layer is exposed.

Since $WF_6$ serves as the gas source for CVD in the subsequent tungsten deposition. When the lower Ti layer is exposed due to the poor step coverage of the $TiN_x$ layer or any defect in the $TiN_x$ layer, F atoms released by $WF_6$ can then pass through the $TiN_x$ layer and react with Ti located below to form $TiF_4$. As $TiF_4$ is a volatile gas, a phenomenon similar to an explosion will occur when tungsten is deposited on the contact window or via opening. This is known as a volcano effect. The occurrence of such effect results in removal or bending of the $TiN_x$ layer, allowing tungsten to be deposited on both sides of the $TiN_x$ layer that are removed. If this occurs on the top end corner of the contact opening or via opening, there will be a projection of the surface of the tungsten layer. When the projection is too severe, it is not easily removed by usual reactive etching process. As a result, this leads to the problems of blind window, short circuit, wafer pollution, and low yield.

Conventionally, the rapid thermal process (RTP) is usually performed in the $N_2$ or $NH_3$ based surroundings to prevent the above from occurring during the manufacture of the contact opening. This performs a nitridation reaction to the exposed Ti layer. However, in view of the thermal budget of the lower metal layer, it is not appropriate to perform a nitridation reaction to the Ti layer with the above RTP.

SUMMARY OF THE INVENTION

The present invention is to provide a method of fabricating the glue layer and the barrier layer, so as to strengthen the structure of the $TiN_x$ glue or barrier layer. This prevents the volcano effect and improves the reliability of the device. A Ti layer is formed on the via opening or contact opening of the substrate using collimator sputtering. Via the control of flow of $N_2$ and Ar, a nitride mode $TiN_x$ layer is formed on the Ti layer. The above nitride mode $TiN_x$ layer and the Ti layer uncovered by the nitride mode $TiN_x$ layer are treated with $N_2$ radiation frequency (RF) plasma.

As embodied and broadly described herein, the invention uses gas source of $N_2$ with a flow rate of 90–150 sccm and Ar with a flow rate of 30–50 sccm to obtain the nitride mode $TiN_x$ layer having a stable resistivity and a preferable level of quality control. The $N_2$ RF plasma treatment step is performed under conditions where the pressure is 1–10 Torr, the temperature is 200–500° C., the flow rate of $N_2$ is 4000–6000 sccm, and the power is 80–200 W. The execution of the step can strengthen the structure of the $TiN_x$ layer and allows the formation of the $TiN_x$ layer by nitridation of the exposed Ti layer. This prevents the occurrence of the volcano effect in the subsequent process of tungsten layer deposition.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
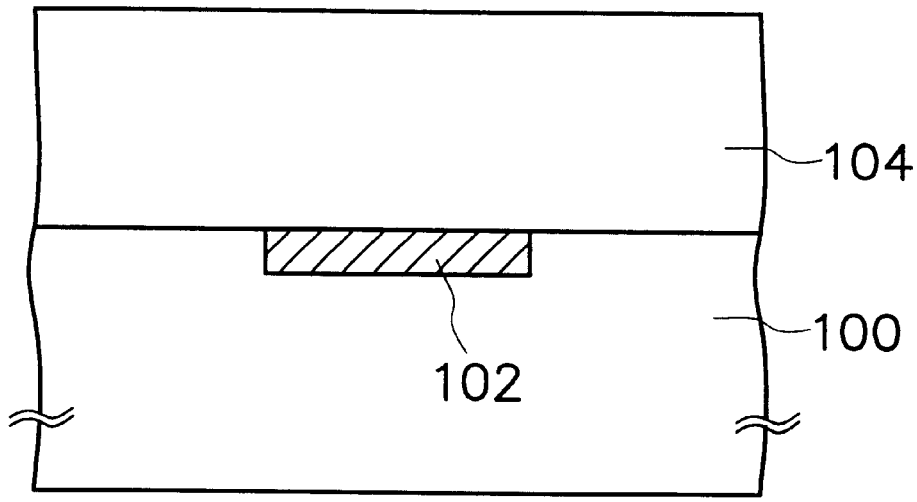
FIGS. 1A to 1E are cross-sectional diagrams showing the process flow for fabricating a via opening according to the present invention.

Reference will now be made in detail to the present preferred embodiments of the invention, examples of which are illustrated in the accompanying drawings. Wherever possible, the same reference numbers are used in the drawings and the description to refer to the same or like parts.

The present embodiment is described with the reference to the process of the via opening. However, it is not used to limit the scope of the invention. In the practical application, the invention is also applied to the manufacture of a contact opening.

FIGS. 1A to 1E are cross-sectional diagrams showing the process flow of fabricating an via opening according to the present embodiment.

Referring to FIG. 1A, a dielectric layer 104 is formed on a substrate 100 with a conducting region 102 formed therein. The conducting region 102 in the present embodiment is a patterned metal layer (the conducting region 102 is a doped region or gate if it is applied to the process of a contact opening). The material for the dielectric layer in this case comprises $SiO_x$ (silicon oxide), phosphosilicate glass (PSG) or boron phosphosilicate glass (BPSG) deposited by CVD, and spin-on-glass (SOG) formed by coating. Depending on the practical requirements, the dielectric layer 104 can be planarized, for example, by chemical mechanical polishing (CMP). The dielectric layer 104 has a more planarized surface, which is advantageous to the performance of the subsequent process.

Figure 1B:
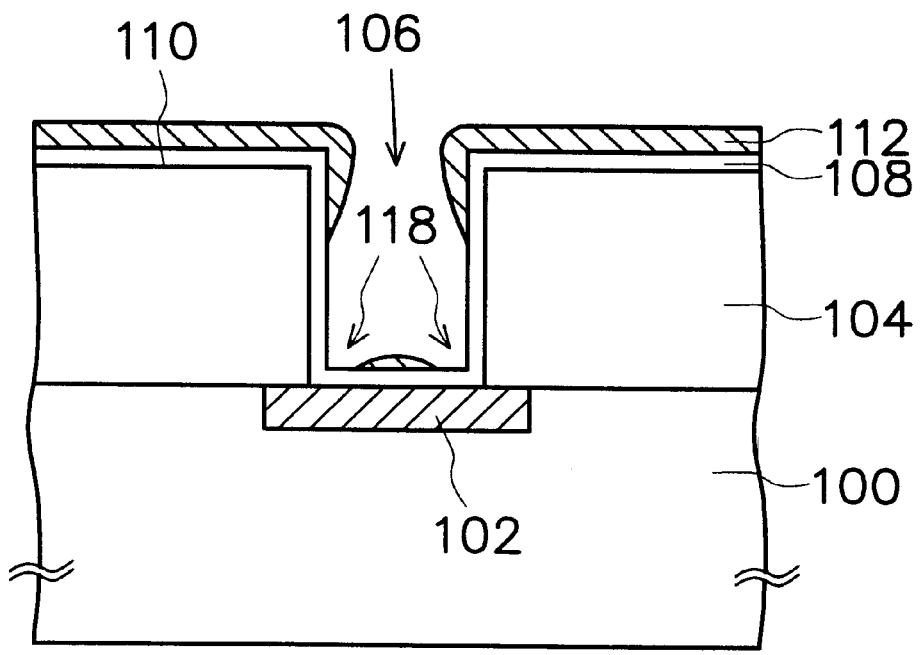

Referring to FIG. 1B, an via opening 106 is formed in the dielectric layer 104 by a conventional photolithographic and etching step (the via opening 106 is a contact opening when the invention is used for the contact opening process). This exposes the conducting region 102 in the substrate 100. The etching process in this case is performed by anisotropic etching with plasma, and with $CF_4$, $CHF_3$ or $C_2F_6$, and $C_3F_8$ serving as an etching gas source. A conformal Ti layer 108 is formed on the substrate to cover a surface of the via opening 106 and an upper surface 110 of the dielectric layer 104. The Ti layer 108 in this case is formed by collimator sputtering to a thickness of 500–1200 Å at a temperature of about 0–400° C.

A nitride mode $TiN_x$ layer 112 is formed on the Ti layer 108. The nitride mode $TiN_x$ layer 112 is, in this case formed by collimator sputtering using $N_2$ and Ar as the gas source. Preferably, the flow rate of $N_2$ is about 90–150 sccm and the flow rate of Ar is about 30–50 sccm. The deposition temperature is about 200–400° C., while the formed thickness is about 600–1200 Å. As the nitride mode $TiN_x$ layer 112 is formed with a higher flow rate of $N_2$ and a lower flow rate of Ar, the nitride mode $TiN_x$ layer 112 obtained has a stable resistivity and better quality control.

Figure 1C:
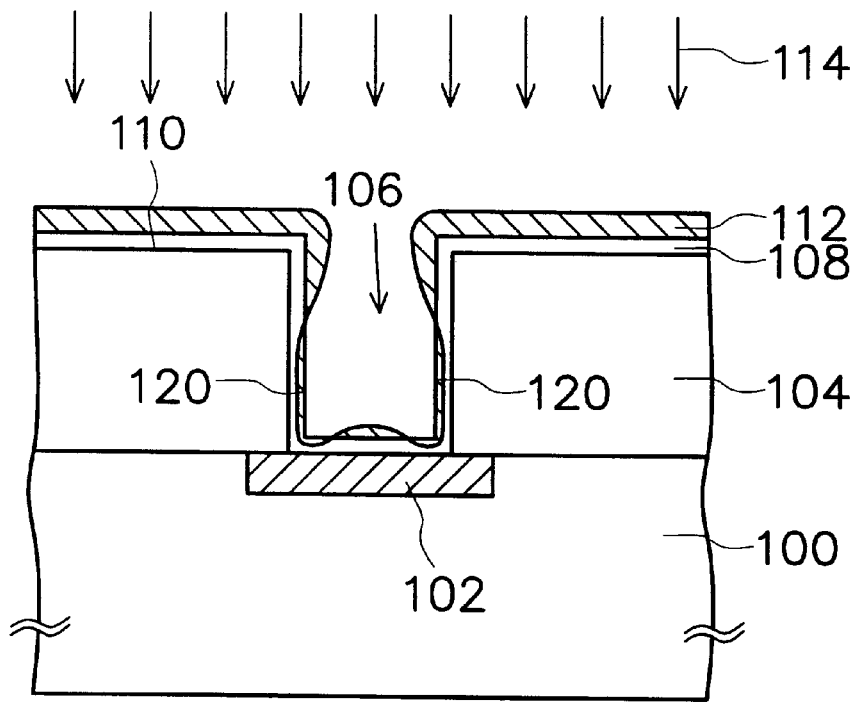

Referring to FIG. 1C, the $N_2$ RF plasma treatment step 114 is performed to improved the nitride content of the above nitride mode $TiN_x$ 112 so as to strengthen the structure. In FIG. 1B, the nitridation reaction of the exposed Ti layer 108 uncovered by the nitride mode $TiN_x$ layer 112 may be produced in 118 illustrated in the diagram, while part of the exposed Ti layer 108 may react as $TiN_x$ layer 120. The preferred $N_2$ RF plasma treatment step of $TiN_x$ is performed under conditions where the pressure is about 1–10 Torr, the temperature is about 200–500° C., the $N_2$ flow rate is about 4000–6000 sccm, and the power is about 80–200 W. Since the execution of the step can strengthen the structure of nitride mode $TiN_x$ layer 112 and allows part of the exposed Ti layer 108 to react as $TiN_x$, the occurrence of the volcano effect can be prevented in the subsequent process of tungsten layer deposition.

Figure 1D:
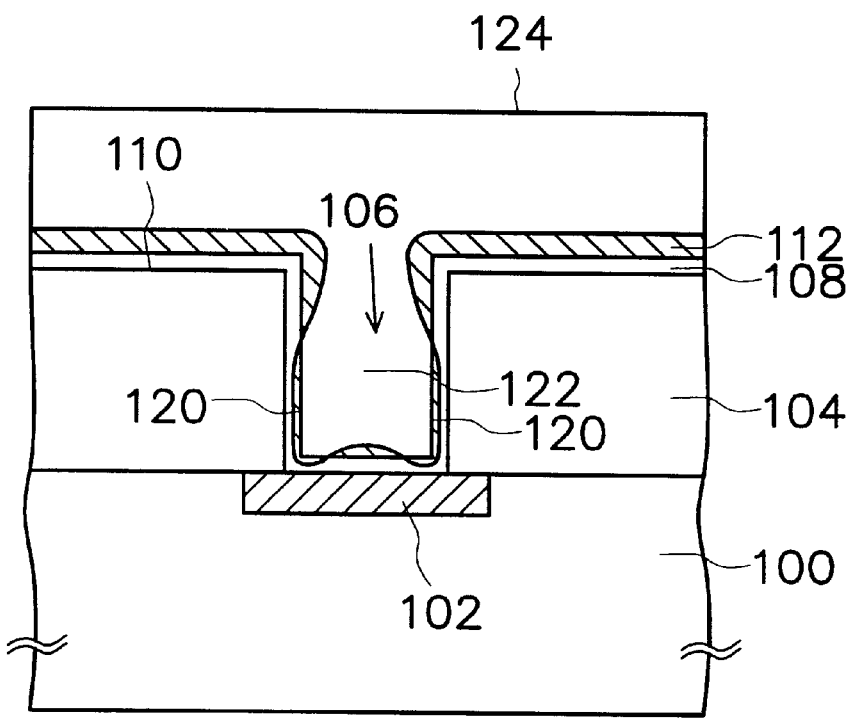

Referring to FIG. 1D, a metal layer 116 is formed on the substrate 100 to fill the via opening. The material for the meal layer 116 includes tungsten. It is formed in this case by CVD using $WF_6$ and H as the gas source, at about 300–500° C.

After the nitride mode $TiN_x$ layer 112 is formed, the $N_2$ RF plasma treatment step in the invention is executed. This can strengthen the structure of the nitride mode $TiN_x$ layer 112 and allows part of the exposed Ti layer 108 uncovered by the nitride mode $TiN_x$ layer to react as $TiN_x$. Therefore, when it is formed by CVD with $WF_6$ and $H_2$ as the gas source, the material used to fill the metal layer 116 is tungsten. The strengthened nitride mode $TiN_x$ layer 112 and the Ti layer 108 which reacts to become a $TiN_x$ layer, have structures that can block F atoms released by $WF_6$. This prevents F atoms from passing through the nitride mode $TiN_x$ layer 112 and reacting with the Ti layer located below to form volatile $TiF_4$. Thus, the invention can prevent the occurrence of the volcano effect and improve the reliability of the device.

Figure 1E:
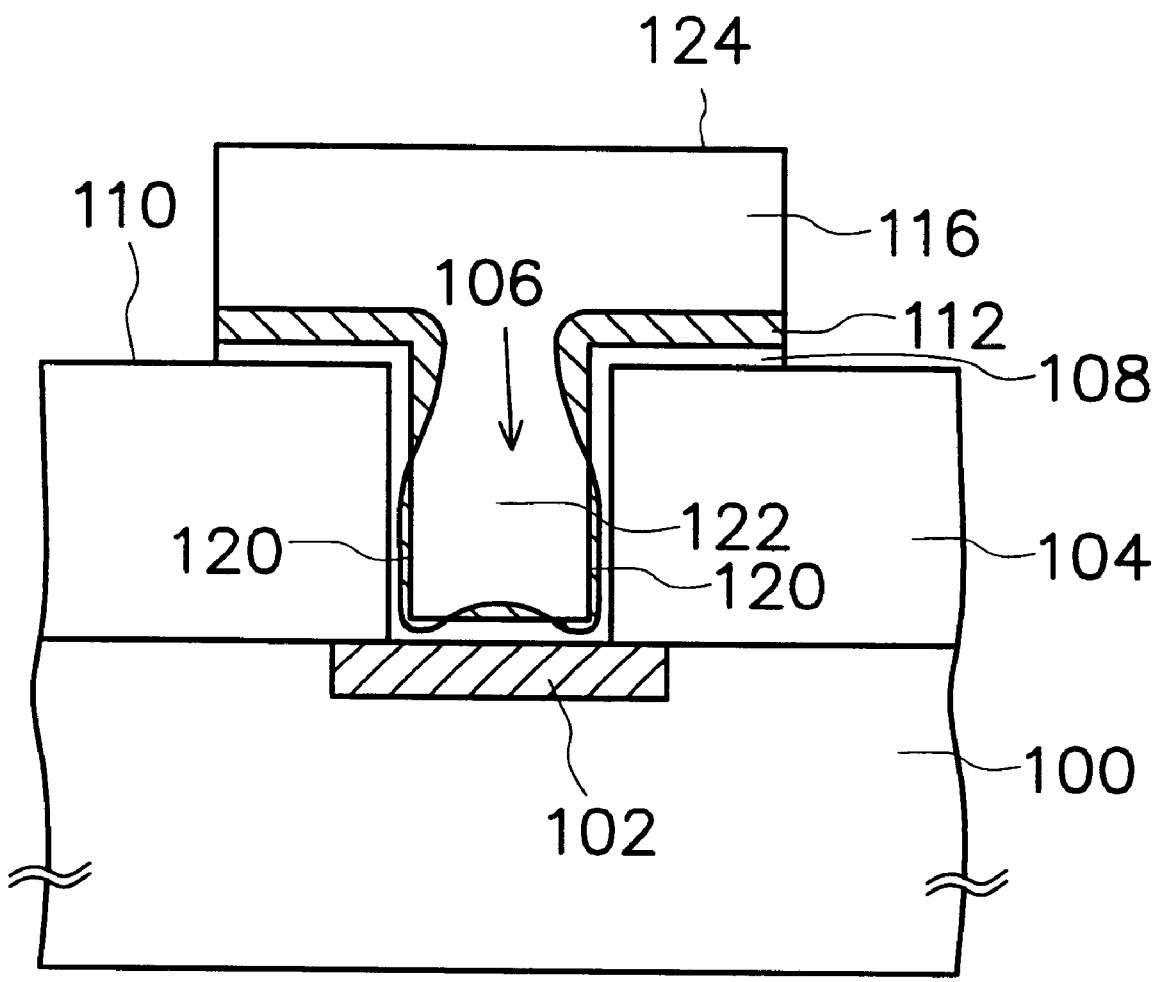

Referring to FIG. 1E, the metal layer 116, the nitride mode $TiN_x$ layer 112, and the Ti layer 108 covering the upper surface 110 of the dielectric layer 104 are defined with photolithographic and etching process. This allows the metal layer 116, the nitride mode $TiN_x$ layer 112, the $TiN_x$ layer 120 and the Ti layer 108 that remains in the via opening 106 to form a via window 124.

It is understood by the present embodiment above that the execution of $N_2$ RF plasma treatment step can strengthen the structure of the $TiN_x$ layer after forming the nitride mode $TiN_x$ layer. This allows the exposed Ti layer to undergo nitridation, forming the $TiN_x$ layer. The occurence of the volcano effect in the subsequent process of tungsten deposition is thus prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of forming a glue layer and a barrier layer, comprising the steps of:
    forming a Ti layer on a substrate;
    forming a nitride mode $TiN_x$ layer on the Ti layer; and
    performing a step of $N_2$ radiation frequency (RF) plasma treatment at a pressure of about 1–10 Torr, a temperature of about 200–360° C., an $N_2$ flow rate of about 4000–6000 sccm, and a power of about 80–200 W.

2. The fabricating method of claim 1, wherein the step for forming the Ti layer involves a collimator sputtering to deposit the Ti layer.

3. The fabricating method of claim 2, wherein the step for forming the nitride mode $TiN_x$ layer involves a collimator sputtering to deposit the nitride mode $TiN_x$ layer.

4. The fabricating method of claim 3, wherein the step for forming the nitride mode $TiN_x$ layer uses $N_2$ and Ar as a gas source.

5. The fabricating method of claim 3, wherein the step for forming the nitride mode $TiN_x$ layer involves using a gas source of $N_2$ with a flow rate of about 90–150 sccm and Ar with a flow rate of about 30–50 sccm.

6. The fabricating method of claim 1, wherein the step for forming the nitride mode $TiN_x$ layer uses a gas source of $N_2$ with a flow rate of about 90–150 sccm and Ar with a flow rate of about 30–50 sccm.

7. A method of fabricating a metal interconnect applicable to a substrate, in which a dielectric layer is formed on the substrate with a via opening in the dielectric layer to expose the substrate, comprising the steps of:
    forming a Ti layer on the substrate to cover the via opening;
    forming a nitride mode $TiN_x$ layer on the Ti layer;
    performing a step of $N_2$ radiation frequency (RF) plasma treatment at a pressure of about 1–10 Torr, a temperature of about 200–360° C., an $N_2$ flow rate of about 4000–6000 sccm, and a power of about 80–200 W;
    forming a metal layer on the substrate to fill the via opening; and
    defining the Ti layer, the nitride mode $TiN_x$ layer, and the metal layer.

8. The fabricating method of claim 7, wherein the step of forming the Ti layer involves a collimator sputtering to deposit the Ti layer.

9. The fabricating method of claim 8, wherein the step of forming the nitride mode $TiN_x$ layer involves a collimator sputtering to deposit the nitride mode $TiN_x$ layer.

10. The fabricating method of claim 9, wherein the step of forming the nitride mode $TiN_x$ uses $N_2$ and Ar as a gas source.

11. The fabricating method of claim 9, wherein the step of forming the nitride mode $TiN_x$ uses a gas source of $N_2$ with a flow rate of about 90–150 sccm and Ar with a flow rate of about 30–50 sccm.

12. The fabricating method of claim 9, wherein the metal layer includes tungsten.

13. The fabricating method of claim 9, wherein the step for forming the nitride mode $TiN_x$ layer uses a gas source of $N_2$ with a flow rate of about 90–150 sccm and Ar with a flow rate of about 30–50 sccm.

14. The fabricating method of claim 9, wherein the metal layer includes tungsten.

* * * * *